United States Patent
Naraine et al.

(10) Patent No.: US 12,362,720 B2
(45) Date of Patent: Jul. 15, 2025

(54) SINGLE FILTER WITH TWO PASSBANDS

(71) Applicant: SKYWORKS SOLUTIONS, INC., Irvine, CA (US)

(72) Inventors: Patrick Marcus Naraine, Boca Raton, FL (US); Satoru Ikeuchi, Ashiya (JP)

(73) Assignee: SKYWORKS SOLUTIONS, INC., Irvine, CA (US)

(*) Notice: Subject to any disclaimer, the term of this patent is extended or adjusted under 35 U.S.C. 154(b) by 31 days.

(21) Appl. No.: 18/213,645

(22) Filed: Jun. 23, 2023

(65) Prior Publication Data
US 2023/0421126 A1 Dec. 28, 2023

Related U.S. Application Data

(60) Provisional application No. 63/355,316, filed on Jun. 24, 2022.

(51) Int. Cl.
*H04B 1/10* (2006.01)
*H03H 7/01* (2006.01)

(52) U.S. Cl.
CPC ............... *H03H 7/0161* (2013.01)

(58) Field of Classification Search
CPC ............................................. H03H 7/0161
USPC ............................... 375/350, 219, 295, 316
See application file for complete search history.

(56) References Cited

U.S. PATENT DOCUMENTS

| | | | |
|---|---|---|---|
| 2009/0115659 A1* | 5/2009 | Watanabe | G01S 19/33 |
| | | | 342/357.73 |
| 2017/0005639 A1* | 1/2017 | Khlat | H03H 9/706 |
| 2019/0181839 A1* | 6/2019 | Bauder | H04B 1/525 |

* cited by examiner

*Primary Examiner* — Zewdu A Kassa
(74) *Attorney, Agent, or Firm* — Lando & Anastasi, LLP

(57) ABSTRACT

Aspects of this disclosure relate to a radio frequency filter with two pass bands. The RF filter employs a first RF bandpass filter coupled to a common RF input and a common RF output. The RF filter further employs a second RF bandpass filter coupled to the common RF input and the common RF output. A first RF pass band of the first RF bandpass filter and a second RF pass band of the RF second bandpass filter are overlapping RF pass bands. Related methods and wireless communication devices are also disclosed.

20 Claims, 9 Drawing Sheets

SINGLE FILTER WITH TWO PASSBANDS

CROSS-REFERENCE TO RELATED APPLICATIONS

This application claims priority under 35 U.S.C. § 119(e) to U.S. Provisional Patent Application Ser. No. 63/355,316, titled "SINGLE FILTER WITH TWO PASSBANDS," filed Jun. 24, 2022, the entire contents of which is incorporated herein by reference for all purposes.

FIELD OF THE INVENTION

Embodiments of the present disclosure relate to filters arranged to filter signals, such as radio frequency signals.

BACKGROUND OF THE INVENTION

Figure 7:
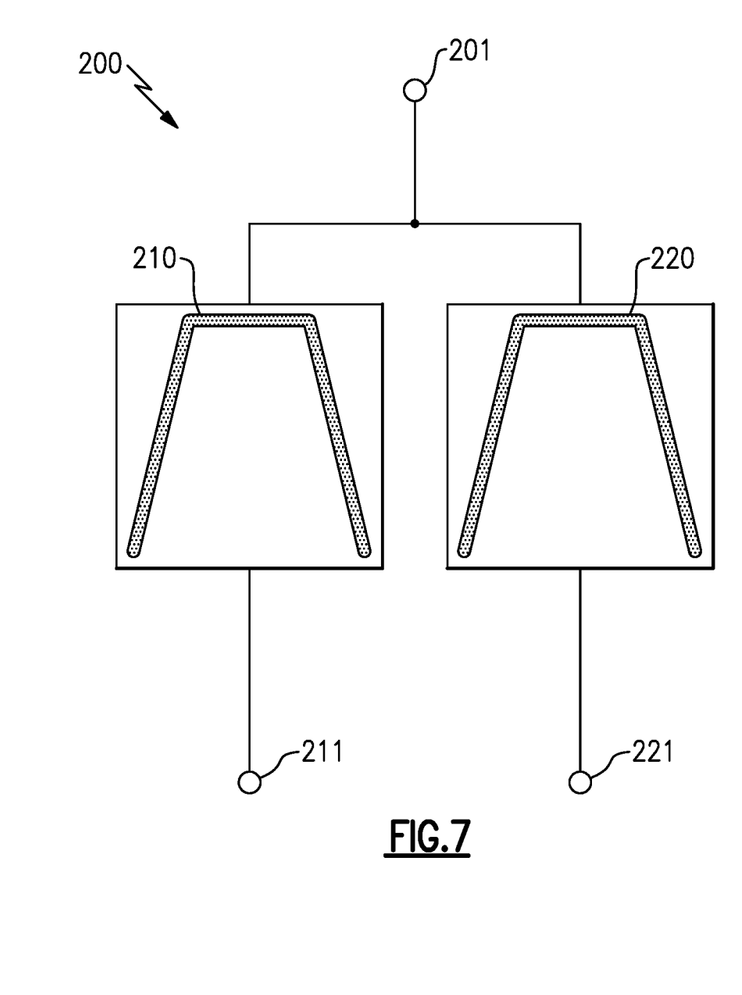
FIG. 7 is a schematic diagram of a known radio frequency filter having a single diplexer.

GPS broadcasts radio frequency ranging signals at three (3) frequencies: L1 (1575.42 MHz), L2 (1227.6 MHz), and L5 (1176.45 MHz). Referring to FIG. 7, a current receiving (RX) front-end module (FEM) architecture for L2 signals and L5 signals employs a diplexer 200 having a common RX filter input (e.g., antenna) 201 coupled to a L2 bandpass filter 210 for implementing a pass band for L2 signals from the RX filter input to a L2 filter output 211 with the common RX filter input also being coupled to a L5 bandpass filter 220 for implementing a pass band for L5 signals from the RX filter input to the L5 filter output 221.

Figure 9A:
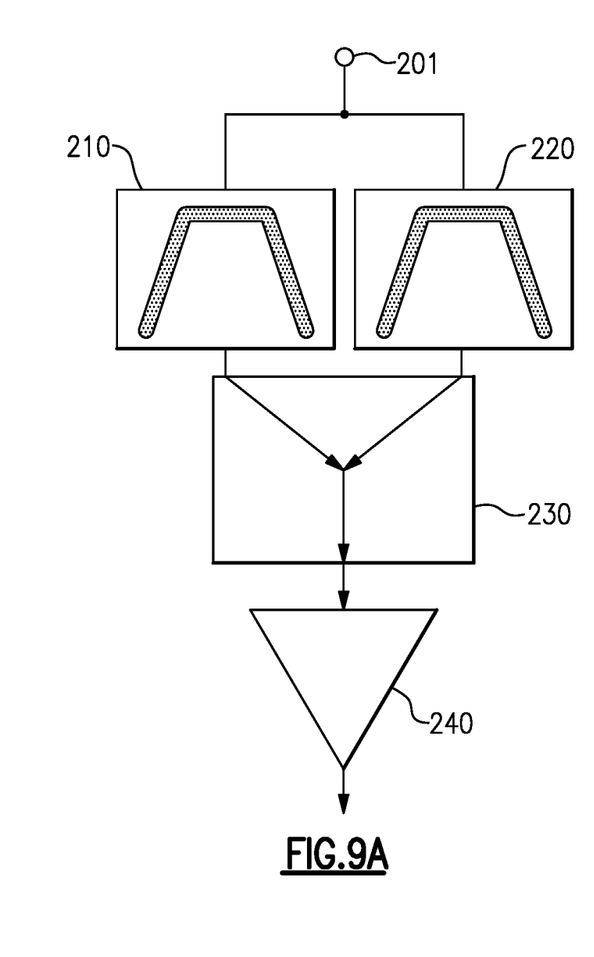
FIG. 9A is a diagram of a first known RX FEM architecture.

In addition to the aforementioned diplexer 200, as shown in FIG. 9A, one current RX FEM architecture may further employ a combiner 230 and a wideband low noise amplifier (LNA) 240. Inputs of the combiner 230 are coupled to the L2 filter output 211 and L5 filter output 221, and an output of the combiner 230 is coupled to an input of the LNA 240. Issues with this RX FEM architecture are high RX loss and high RX noise.

Figure 9B:
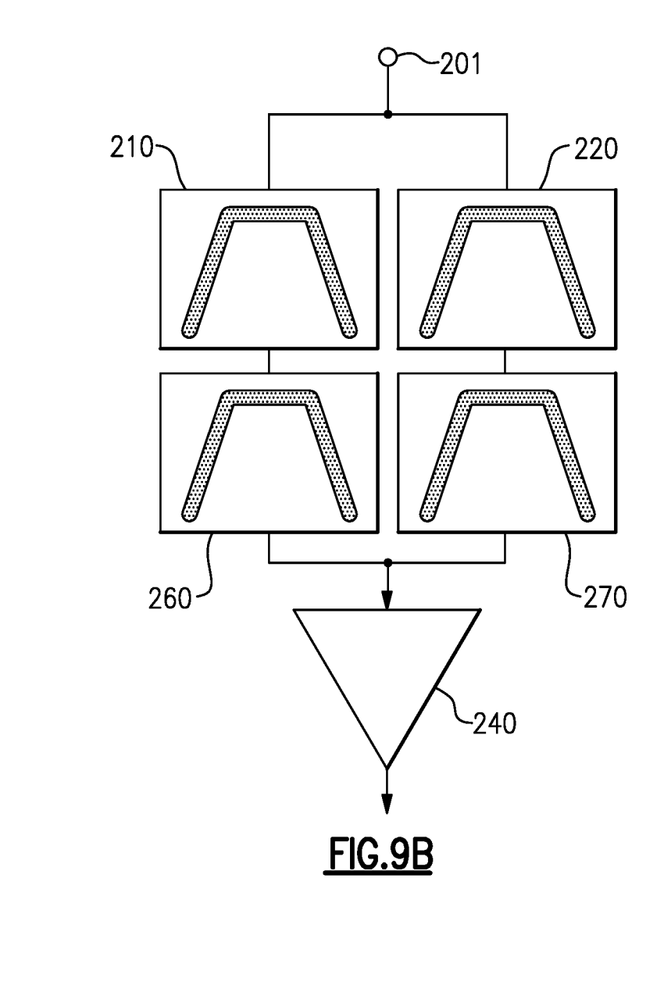
FIG. 9B is a diagram of a second known RX FEM architecture.

An alternative current RX FEM architecture, as shown in FIG. 9B, may employ forward surface acoustic wave (SAW) diplexer 210, 220 coupled to a reverse SAW diplexer 260, 270 in lieu of a single diplexer and a combiner. While this architecture removes the combiner, the issues of RX loss and RX noise still exist.

Figure 8:
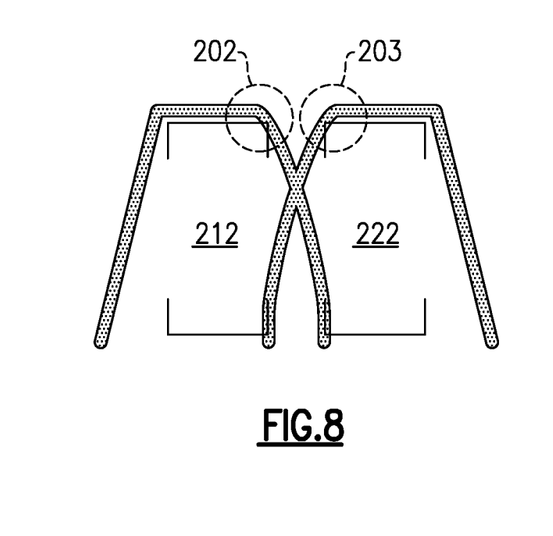
FIG. 8 is a diagram of a waveform of the radio frequency filter of FIG. 7.

Moreover, the aforementioned diplexer design of the L2 bandpass filter 210 must reject L5 signals to avoid L5 signals from leaking to the L2 filter output 211. Otherwise, as shown in FIG. 8, the L5 filter output 222 will degrade resulting in a deterioration 203 of a frequency band closest to a passband 212 of the L2 bandpass filter 210.

Conversely, the L5 bandpass filter 220 must reject L2 signals to avoid L2 signals from leaking to the L5 filter output 221. Otherwise, as shown in FIG. 8, the L2 filter output 211 will degrade resulting in a deterioration 202 of a frequency band closest to the passband 222 of the L5 bandpass filter 220.

Additionally, the size requirement for L2 bandpass filter 210 and L5 bandpass filter 220 increases due to the aforementioned rejection requirement.

Figure 10:
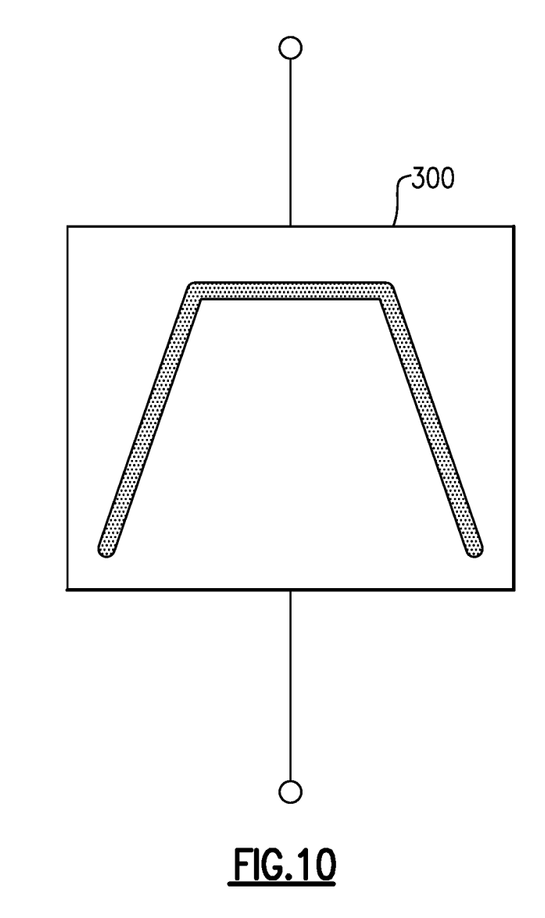
FIG. 10 is a diagram of yet another known RX FEM architecture with a single filter having a wide passband.
Figure 11:
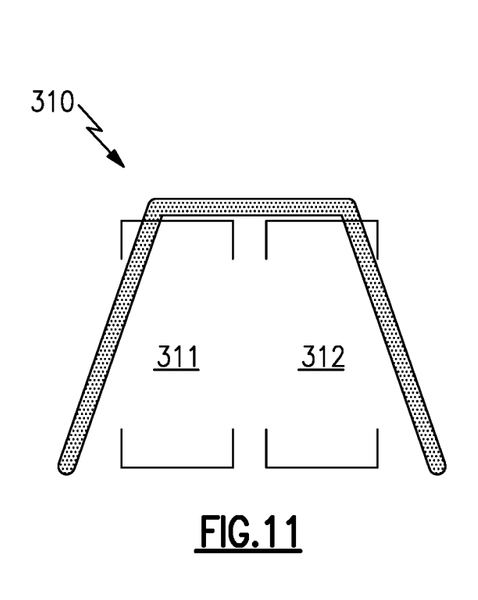
FIG. 11 is a diagram of a waveform of the radio frequency filter of FIG. 10.
Figure 12:
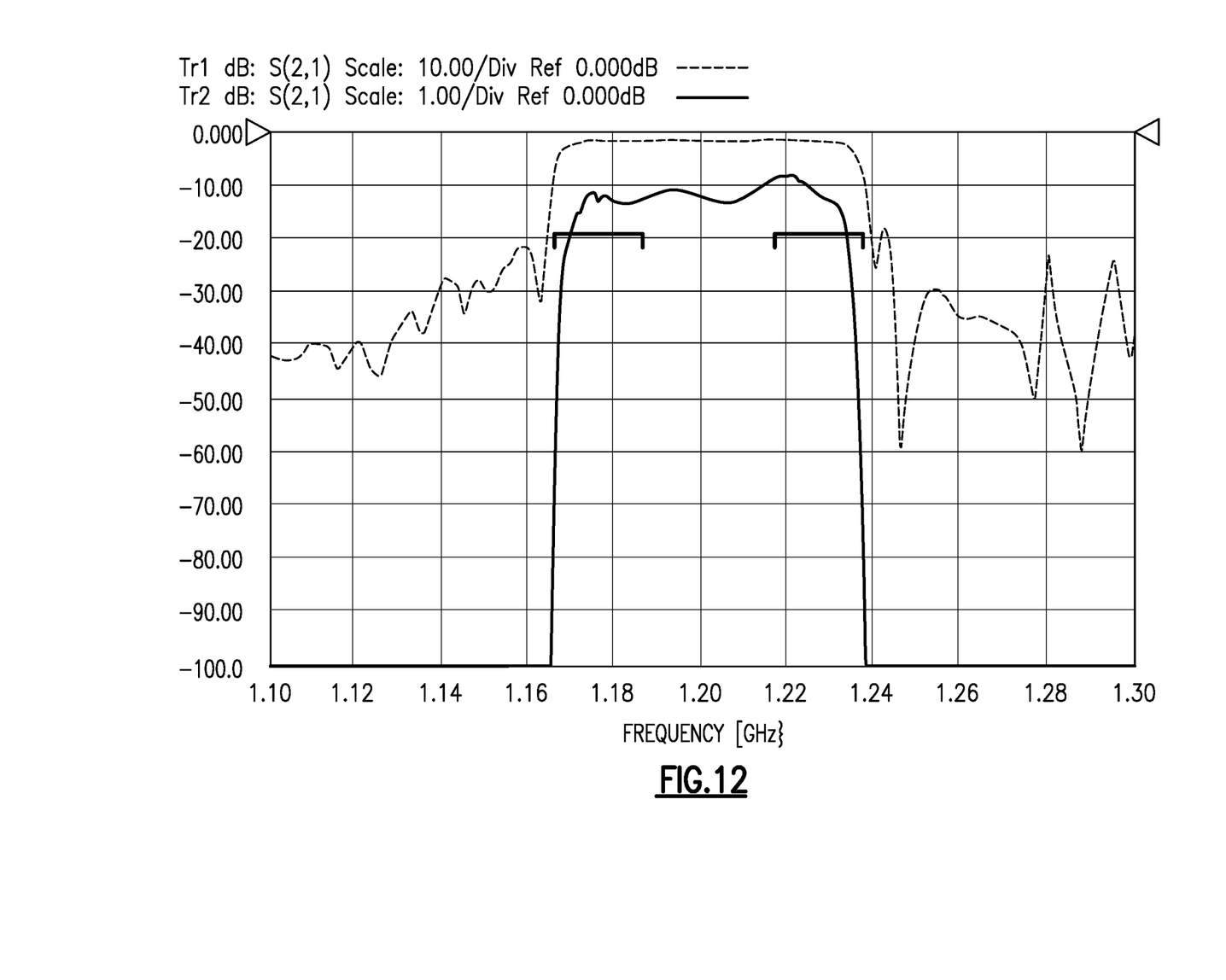
FIG. 12 is a graph of attenuation versus frequency for the FEM of FIG. 11.

Yet an alternative RX FEM architecture, as shown in FIG. 10, may be designed to employ a single filter 300 with a passband bandwidth wide enough to cover both L2 and L5 frequency bands. Unfortunately, current technology is not yet capable of providing such a filter with such a wide passband and as a result, as shown in FIG. 11, lower frequencies within a L5 frequency band 311 and upper frequencies within a L2 frequency band 312 would not be within a passband 310 of filter 300. FIG. 12 a graphical simulation of FIG. 11.

SUMMARY

The innovations described in the claims each have several aspects, no single one of which is solely responsible for its desirable attributes. Without limiting the scope of the claims, some prominent features of this disclosure will now be briefly described.

One aspect of the disclosure is a RX FEM architecture with a single RF filter with two pass bands. The RF filter employs a first RF bandpass filter coupled to a common RF input and a common RF output. The RF filter further employs a second RF bandpass filter coupled to the common RF input and the common RF output. A first RF pass band of the first RF bandpass filter and a second RF pass band of the RF second bandpass filter are overlapping RF pass bands.

The first RF bandpass filter may filter GPS L2 signals, and the second RF bandpass filter may filter GPS L5 signals.

Another aspect of this disclosure may be a wireless communication device employing the single RF filter with two pass bands.

The wireless communication device may be a mobile device or a GPS unit.

Another aspect of the disclosure is a method of filtering radio frequency signals. The method involves a filtering of a first RF signal from a common RF input through a first RF pass band of a first RF bandpass filter to a common RF output, and a filtering of a second RF signal from a common RF input through a second RF pass band of a second RF bandpass filter to the common RF output. A first RF bandpass of the first RF bandpass filter and a second RF bandpass of the RF second bandpass filter are overlapping RF frequency bands.

The first RF signal may be a GPS L2 signal, and the second RF signal may be a GPS L5 signal.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and are not intended to affect the meaning or scope of the claims.

Figure 1:
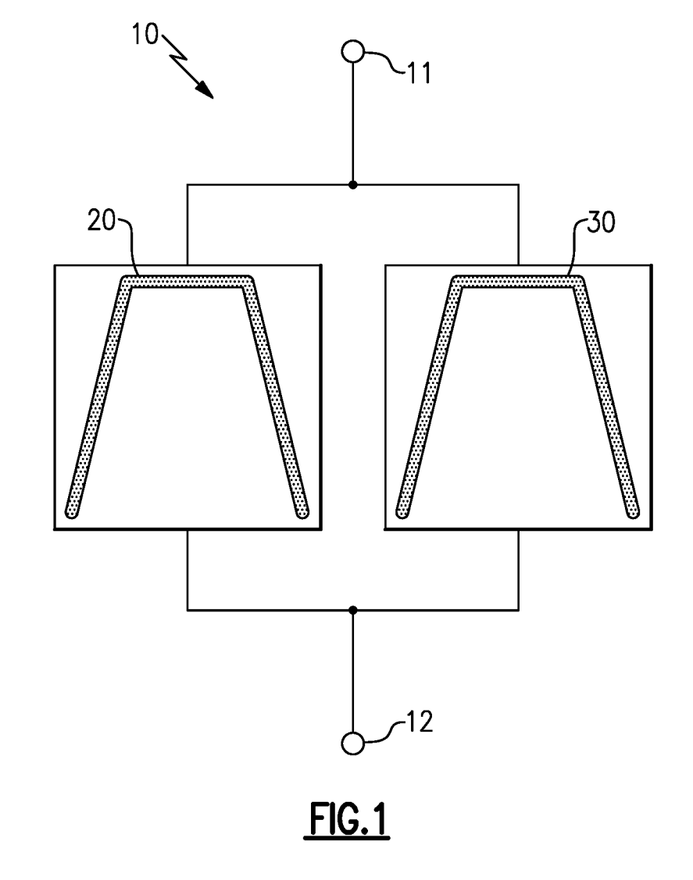
FIG. 1 is a schematic diagram of one example of a radio frequency filter in accordance with various aspects of the present disclosure.

FIG. 1 is a schematic diagram of one example RF filter 10 of the present disclosure including a first RF bandpass filter 20 and a second RF bandpass filter 30. Both filters 20 and 30 are coupled to a common RF input 11 and a common RF output 12.

Figure 2:
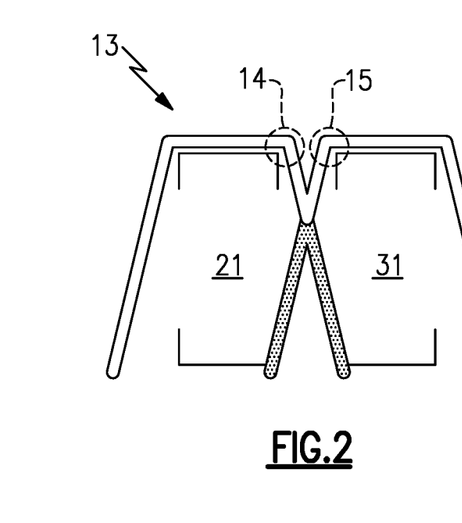
FIG. 2 is a diagram of a waveform of the radio frequency filter of FIG. 1.
Figure 3:
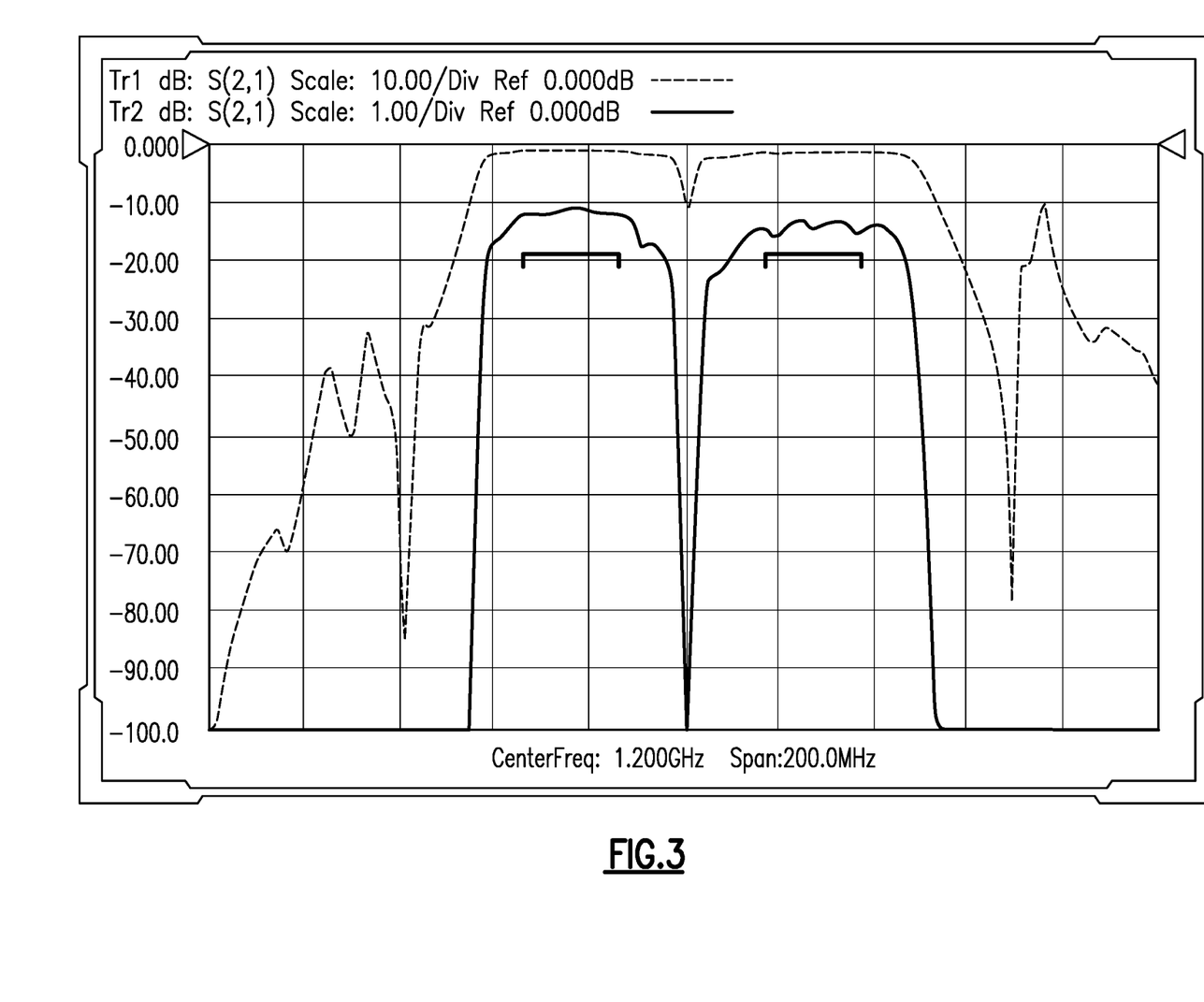
FIG. 3 is a graph of a simulation showing the dual pass bands of the radio frequency filter of FIG. 1.

As shown in FIG. 2, first RF bandpass filter 20 has a pass band 21 and second RF bandpass filter 30 has a pass band 31 that are overlapping pass bands. Each of the pass bands 21 and 31 are relatively narrow pass bands with steep filter skirts. As will be further explained, a waveform 13 of the RF filter 10 as shown in FIG. 2 has zero degradation 14 and zero degradation 15, because any RF signal received by common RF input 11 that is within pass band 21 or pass band 31 (e.g., any leakage) will still be filtered to common RF output 11 as shown, for example, in FIG. 3. As a result, there is no deterioration of pass band 21 and pass band 31, which enables a smaller filter size, a lower system noise, a lower system cost and a smaller FEM footprint than with conventional RF filters.

Figure 4:
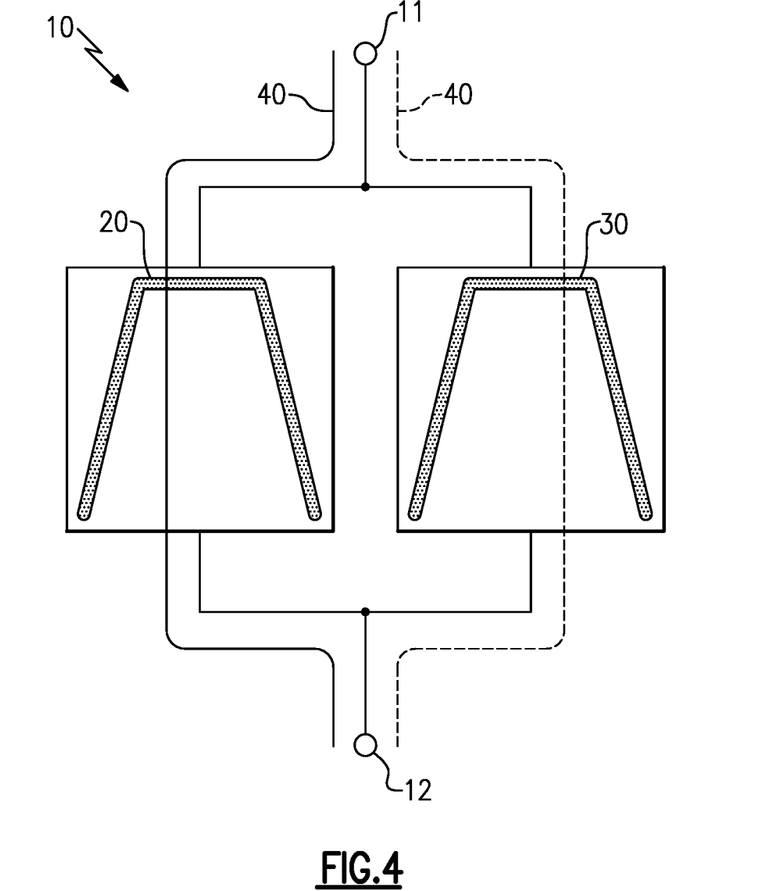
FIG. 4 is a schematic diagram of a first example of RF filtering by the radio frequency filter of FIG. 1.

For example, FIG. 4 illustrates a filtering of a first RF signal 40 within RF pass band 21 (FIG. 2) from common RF input 11 through first RF bandpass filter 20 to common RF output 12. In operation, if the first RF signal 40 leaks from common RF input 11 through second RF bandpass filter 30 to common RF output 12, then pass band 21 will not be degraded since the first RF signal 40 is filtered by second RF bandpass filter 30 to common RF output 12. Thus, output deterioration will not occur and there a rejection of first RF signal 40 by second RF bandpass filter 30 is not required.

Figure 5:
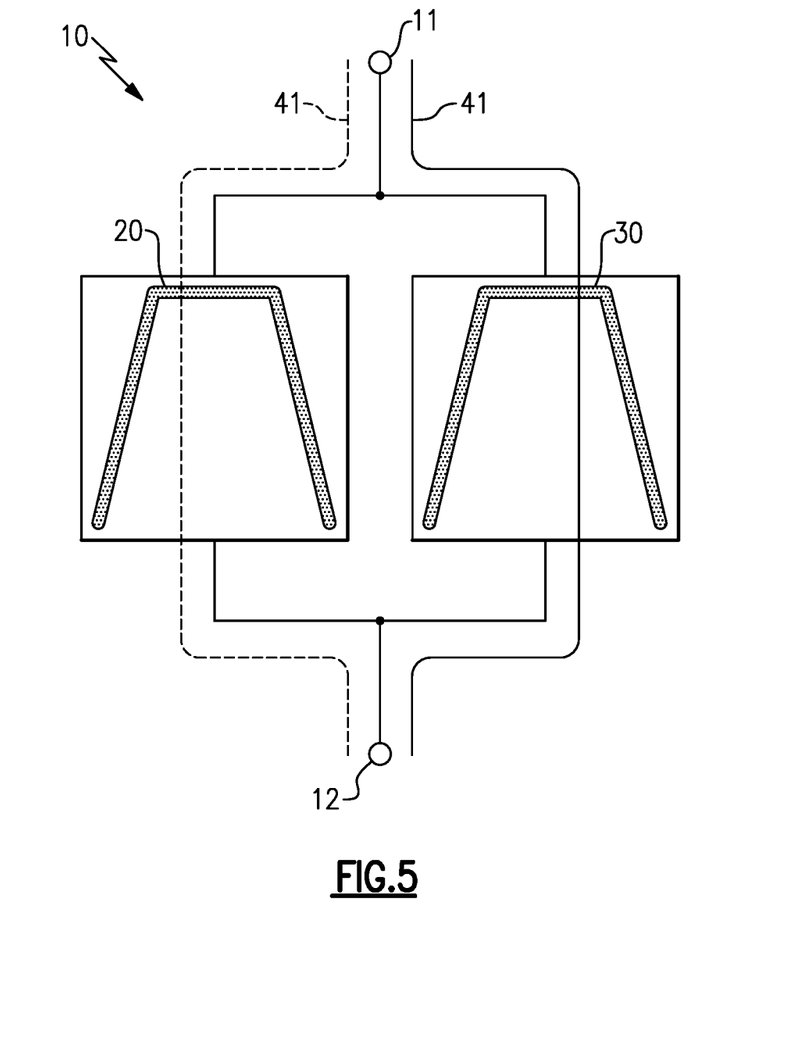
FIG. 5 is a schematic diagram of a second example RF filtering by the radio frequency filter of FIG. 1.

Conversely for example, FIG. 5 illustrates a filtering of a second RF signal 41 within RF pass band 31 (FIG. 2) from common RF input 11 through second RF bandpass filter 30 to common RF output 12. In operation, if the second RF signal 41 leaks from common RF input 11 through first RF bandpass filter 20 to common RF output 12, then pass band 31 will not be degraded since the second RF signal 41 is filtered by first RF bandpass filter 20 to common RF output 12. Thus, output deterioration will not occur and there a rejection of first RF signal 41 by first RF bandpass filter 20 is not required.

In practice, first RF signal 41 may be a GPS L2 signal with first RF bandpass filter 20 filtering GPS L2 signals, and second RF signal 42 may be a GPS L5 signal with second RF bandpass filter 30 filtering GPS L5 signals. Each of the filters 20 and may be narrow band filters with steep skirts. For example, the filter 20 may have a center frequency of about 1227.6 MHz and a width of about plus or minus ($\pm$) 6 MHZ, and the filter 30 may have a center frequency of about 1176.45 MHz and a width of about plus or minus ($\pm$) 7 MHz The RF filter with two pass bands disclosed herein can be included in wireless communication devices, such as mobile devices. One or more RF filters with two pass bands in accordance with any suitable principles and advantages disclosed herein can be implemented in any suitable wireless communication device. An example of such a wireless communication device will be discussed with reference to FIG. 6.

Figure 6:
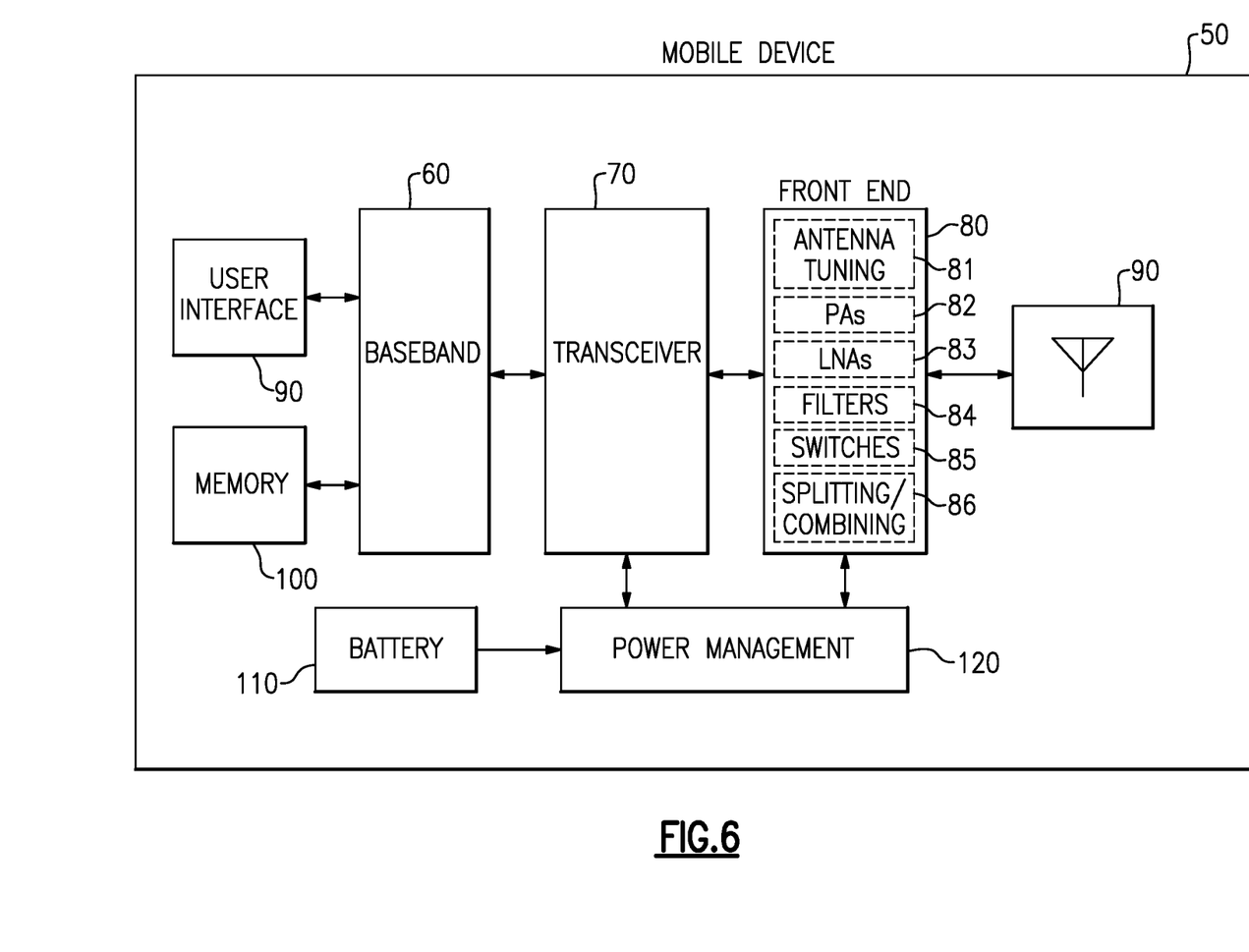
FIG. 6 is a schematic diagram of a mobile phone of the present disclosure.

FIG. 6 is a schematic diagram of one embodiment of a mobile device 50. The mobile device 50 includes a baseband system 60, a transceiver 70, a front end system antennas 90, a power management system 120, a memory 100, a user interface 90, and a battery 110.

The mobile device 50 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 70 generates RF signals for transmission and processes incoming RF signals received from the antennas 90. It will be understood that various functionalities associated with the transmission and receiving of RF signals can be achieved by one or more components that are collectively represented in FIG. 6 as the transceiver 70. In one example, separate components (for instance, separate circuits or dies) can be provided for handling certain types of RF signals.

The front end system 80 aids in conditioning signals transmitted to and/or received from the antennas 90. In the illustrated embodiment, the front end system 80 includes antenna tuning circuitry 81, power amplifiers (PAs) 82, low noise amplifiers (LNAs) 83, filters 84, switches 85, and signal splitting/combining circuitry 86. However, other implementations are possible. The filters 84 include one or more RF filters with two pass bands with that include one or more features of the embodiments disclosed herein (e.g., RF filter 10 of FIG. 1).

The front end system 80 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 50 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 90 can include antennas used for a wide variety of types of communications. For example, the antennas 90 can include antennas for transmitting and/or receiving signals associated with a wide variety of frequencies and communications standards.

In certain implementations, the antennas 90 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 50 can operate with beamforming in certain implementations. For example, the front end system 80 can include amplifiers having controllable gain and phase shifters having controllable phase to provide beam formation and directivity for transmission and/or reception of signals using the antennas 90. For example, in the context of signal transmission, the amplitude and phases of the transmit signals provided to the antennas 90 are controlled such that radiated signals from the antennas 90 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 90 from a particular direction. In certain implementations, the antennas 90 include one or more arrays of antenna elements to enhance beamforming.

The baseband system 60 is coupled to the user interface 90 to facilitate processing of various user input and output (I/O), such as voice and data. The baseband system 60 provides the transceiver 70 with digital representations of transmit signals, which the transceiver 70 processes to generate RF signals for transmission. The baseband system 60 also processes digital representations of received signals provided by the transceiver 70. As shown in FIG. 6, the baseband system 60 is coupled to the memory 100 of facilitate operation of the mobile device 50.

The memory 100 can be used for a wide variety of purposes, such as storing data and/or instructions to facilitate the operation of the mobile device 50 and/or to provide storage of user information.

The power management system 120 provides a number of power management functions of the mobile device 50. In certain implementations, the power management system 120 includes a PA supply control circuit that controls the supply voltages of the power amplifiers 811. For example, the power management system 120 can be configured to change the supply voltage(s) provided to one or more of the power amplifiers 811 to improve efficiency, such as power added efficiency (PAE).

As shown in FIG. 6, the power management system 120 receives a battery voltage from the battery 110. The battery 110 can be any suitable battery for use in the mobile device 50, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 1 GHz to 5 GHz, such as in a frequency range from about 1 GHz to 3 GHz.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel filters, wireless communication devices, apparatus, methods, and systems described herein may be embodied in a variety of other forms. Furthermore, various omissions, substitutions and changes in the form of the filters, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A radio frequency (RF) filter, comprising:
    a common RF input and a common RF output;
    a first RF bandpass filter coupled to the common RF input and the common RF output; and
    a second RF bandpass filter coupled to the common RF input and the common RF output and in parallel with the first RF bandpass filter, a first RF pass band of the first RF bandpass filter and a second RF pass band of the second RF bandpass filter being overlapping RF pass bands.

2. The RF filter of claim 1 wherein the first RF pass band of the first RF bandpass filter filters GPS L2 signals, and wherein the second RF pass band of the second RF bandpass filter filters GPS L5 signals.

3. The RF filter of claim 1 wherein the first RF bandpass filter has a narrow pass band centered about 1227.6 MHz and the second RF bandpass filter has a narrow pass band centered about 1176.45 MHz.

4. The RF filter of claim 3 wherein the first RF bandpass filter and the second RF bandpass filter have steep skirts.

5. The RF filter of claim 1 wherein the RF filter is included in a front end module of a wireless device.

6. The RF filter of claim 5 wherein the wireless device is a mobile device.

7. The RF filter of claim 5 wherein the front end module further comprises a plurality of amplifiers.

8. A wireless communication device, comprising:
    an antenna for receiving radio frequency (RF) signals; and
    an RF filter coupled to the antenna for filtering the RF signals, the RF filter including
        a common RF input and a common RF output,
        a first RF bandpass filter coupled to the common RF input and the common RF output, and
        a second RF bandpass filter coupled to the common RF input and the common RF output, a first RF pass band of the first RF bandpass filter and a second RF pass band of the second RF bandpass filter being overlapping RF pass bands.

9. The wireless communication device of claim 8 wherein the first RF pass band of the first RF bandpass filter filters GPS L2 signals, and wherein the second RF pass band of the second RF bandpass filter filters GPS L5 signals.

10. The wireless communication device of claim 8 wherein the first RF bandpass filter has a narrow pass band centered about 1227.6 MHz and the second RF bandpass filter has a narrow pass band centered about 1176.45 MHz.

11. The wireless communication device of claim 10 wherein the first RF bandpass filter and the second RF bandpass filter have steep skirts.

12. The wireless communication device of claim 8 wherein the RF filter is included in a front end module of the wireless communication device.

13. The wireless communication device of claim 12 wherein the wireless communication device is a mobile device.

14. The wireless communication device of claim 12 wherein the front end module further comprises a plurality of amplifiers.

15. A method of filtering radio frequency (RF) signals, comprising:
    filtering a first portion of a first RF signal from a common RF input through a first RF pass band of a first RF bandpass filter to a common RF output; and
    filtering a second portion of the first RF signal from a common RF input through a second RF pass band of a second RF bandpass filter to the common RF output, the first RF pass band of the first RF bandpass filter and the second RF pass band of the second RF bandpass filter being overlapping RF pass bands.

16. The method of claim 15 wherein the first RF pass band of the first RF bandpass filter filters GPS L2 signals, and wherein the second RF pass band of the second RF bandpass filter filters GPS L5 signals.

17. The method of claim 16 wherein the first RF bandpass filter has a narrow pass band centered about 1227.6 MHz and the second RF bandpass filter has a narrow pass band centered about 1176.45 MHz.

18. The method of claim 17 wherein the first RF bandpass filter and the second RF bandpass filter have steep skirts.

19. The method of claim 15 wherein the first RF bandpass filter and the second RF bandpass filter are included in a front end module of a wireless device.

20. The method of claim 19 wherein the wireless device is a mobile device.

* * * * *